United States Patent [19]

Atria

[11] Patent Number: 5,323,116
[45] Date of Patent: Jun. 21, 1994

[54] TEST DEVICE FOR TESTING COMPACT FLUORESCENT LIGHTS AND BALLASTS

[76] Inventor: Joseph M. Atria, 9381 N.W. 16th St., Plantation, Fla. 33322

[21] Appl. No.: 825,111

[22] Filed: Jan. 24, 1992

[51] Int. Cl.⁵ .................................. G01R 31/02
[52] U.S. Cl. ............................ 324/511; 324/414; 340/653
[58] Field of Search ............... 324/403, 414, 511, 556, 324/133; 340/641, 652, 653

[56] References Cited

U.S. PATENT DOCUMENTS

| | | | |
|---|---|---|---|
| 2,754,476 | 7/1956 | Wallach | 324/414 |
| 2,756,384 | 7/1956 | Meyer | 324/414 |
| 3,594,636 | 7/1971 | Gibbs | 324/414 |
| 3,688,185 | 8/1972 | Masengil | 324/414 |
| 3,701,942 | 10/1972 | Kobayashi et al. | 324/414 |
| 4,318,031 | 3/1982 | Lonsoth et al. | 340/653 |
| 4,730,163 | 3/1988 | Santos | 324/414 |
| 4,734,650 | 3/1988 | Alley et al. | 324/414 |

FOREIGN PATENT DOCUMENTS 2535930  5/1984  France .................. 324/414

Primary Examiner—Maura K. Regan
Attorney, Agent, or Firm—Oltman and Flynn

[57] ABSTRACT

In accordance with the invention there is provided a test device for testing a circuit including a compact fluorescent light having first and second terminals, an ac-power source including first and second ac-power lines, and a ballast in the ac-power source. The test device has current indicating means for testing presence of electric current in the circuit, and voltage indicating means for indicating presence of voltage between the first and second power lines.

10 Claims, 3 Drawing Sheets

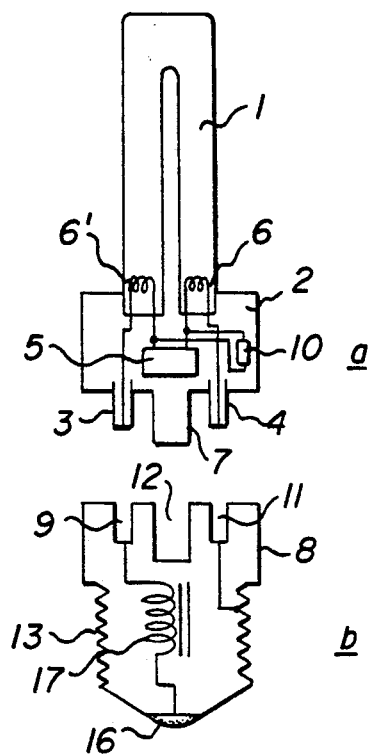
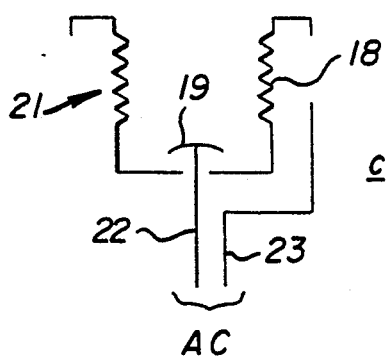
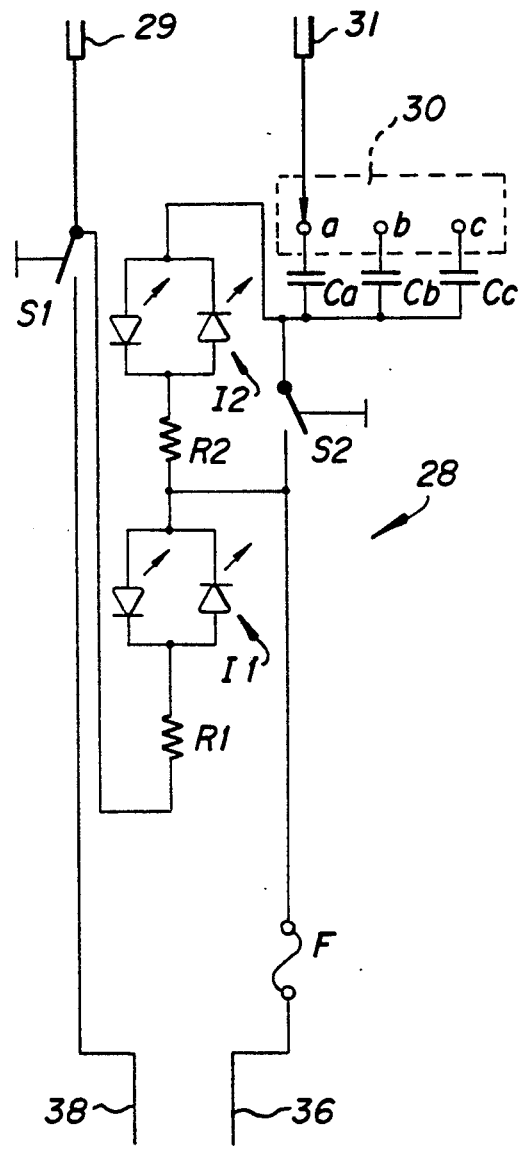
FIG. 1
PRIOR ART
FIG. 3

TEST DEVICE FOR TESTING COMPACT FLUORESCENT LIGHTS AND BALLASTS

The invention relates to a testing device for testing compact fluorescent lights and their associated ballast, and more specifically to such a testing device that is small and compact and readily plugged into a light fixture.

BACKGROUND

Fluorescent lights of small compact construction have in recent years gained popularity because they can replace conventional incandescent light bulbs, but offer longer life and improved efficiency in regard to power consumption versus light output.

As often used, the compact fluorescent lights are provided with a plug-in base that mates with an adapter for receiving the light and having a threaded base that fits in the conventional incandescent lamp socket. The compact fluorescent light, in the following called "compact light", requires a so-called ballast which limits the amount of current drawn by the compact light. This ballast is conventionally mounted in the adapter so that it need not be replaced whenever the compact light is to be replaced. There are several types of compact lights and corresponding light fixtures. Some types fit directly into the fixture, with the ballast installed in the fixture. The invention is not directed to the particular type of compact light and the fixture adapted to the light, but to an arrangement for testing the compact light and fixture.

The arrangement of a compact light with its ballast, however, presents a problem to the user in that occasionally the ballast fails, either in the open mode or the shorted mode. When it begins to fail in the shorted mode, which is the most frequent failure mode, it also causes the destruction of the compact light since the current flow through the light in this situation rises to a high value that almost instantaneously burns out the compact light. When a service person subsequently replaces the burned-out compact light, not knowing that the ballast has failed in the shorted mode, the replacement compact light will soon or immediately be destroyed, as the current value rises.

On the other hand, if the ballast has failed in the open mode or power is missing, the service person will only note that the replacement compact light does not light up but will not know whether the compact light or the ballast are faulty, or power is missing.

It is accordingly the object of the present invention to provide a small, compact test device that can be inserted between the adapter and the compact light here used as a test light, and has two indicator lights and two push-button switches that quickly tells a service person whether a fault is in the ballast or in the compact light.

SUMMARY OF THE INVENTION

In accordance with the invention there is provided a test device for testing a circuit including a compact fluorescent light having first and second terminals, an ac-power source including first and second ac-power lines, and a ballast in the ac-power source. The test device has current indicating means for testing presence of electric current in the circuit, and current continuity indicating means for indicating current continuity through the compact light to prove that it is in working condition in order to perform the test.

The test device may further include a neon light or light-emitting diodes in the current indicating means, and/or a neon light in the voltage indicating means, and/or at least one light emitting diode in the voltage indicating means.

The test device further includes current limiting means in series connection with the current indicating means, wherein the current limiting means can be a capacitor.

The test device may further include a momentary make switch in parallel with the current indicating means, and a momentary make switch in series with the current limiting means.

The test device advantageously includes detachable connecting means for detachably connecting the test device between the compact fluorescent light and the ac-power source, and a test device housing having receiving means for receiving the compact fluorescent light, and plug-in means for plugging-in the device into the ac-power source by means of adapters for different style bases. Note: Adapter can be plugged in either way and receive the same test results.

The test device may additionally include a fuse in series with the ac-power source in the test device for protecting the ac-power source.

Further objects and advantages of this invention will be apparent from the following detailed description of a presently preferred embodiment which is illustrated schematically in the accompanying drawings.

BRIEF DESCRIPTION OF THE DRAWINGS

FIG. 1 is a block diagram showing an example of the prior art;

FIG. 3 is a wiring diagram of the invention including a fuse;

Figure 2:
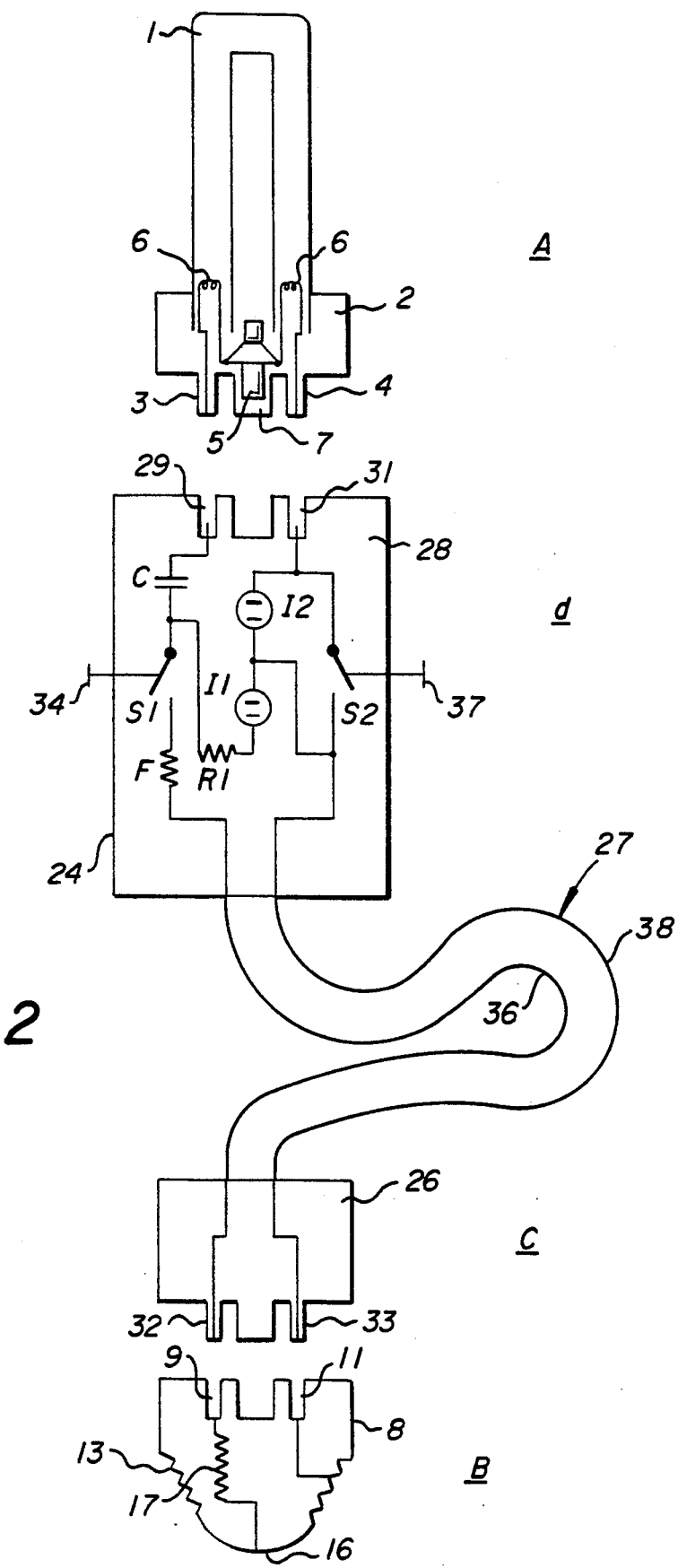
FIG. 2 is a block diagram of the invention showing the arrangement of the various parts.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

DESCRIPTION OF THE PREFERRED EMBODIMENTS

FIG. 1, detail a, shows a conventional compact fluorescent light 1 mounted in its conventional base 2 which has two contact pins 3, 4 connected inside the base to respective filaments 6, 6' of the compact light 1. The base 2 has a center tab 7, and mates with an adapter 8, that has female terminals 9, 11 that receive respective pins 3, 4 and a recess 12 that receives the tab 7.

A light starter 5 of conventional construction is mounted in the base 2 of the compact light 1. As ac-voltage is applied to pins 3 and 4, a contact in the starter 5 momentarily connects the two filaments 6, 6' in series, and they become red hot, starting the electric discharge through the tubular light element of the compact light 1. A capacitor 10 is in some cases connected across the starter 5 to enhance its operation, and prolong its life.

The adapter 8, detail b, has a conventional metallic screw thread 13 and a bottom terminal 16, as known from incandescent light bases, wherein one of the screw thread 13 or the bottom terminal 16 is connected via a ballast 17 to one of the female terminals 9, 11, and the other one of the screw thread 13 or the bottom terminal 16 is connected to the other one of the female terminals 9, 11.

The ballast 17 is a small inductor wound on a ferromagnetic core, and has sufficient inductance to limit the current in the compact light to a proper current value.

FIG. 1, detail c, is a conventional incandescent light socket 21 having a metallic inside thread 18 matching the metallic thread 13 and a bottom contact 19 that connects with the bottom terminal 16 of the adapter 8 when the adapter 8 is screwed into the socket 21. An electric ac-power source is connected via power lines 22, 23 respectively to the bottom contact 19 and the inside thread 18.

When parts a, b and c are assembled an electric circuit is established from the ac-power source, power lines 22, 23, such that ac-current flows from power line 22, via bottom contact 19, bottom terminal 16, ballast 17, female terminal 9, pin 3, filament 6', through an arc discharge in light 1 to filament 6, pin 4, female terminal 11, metallic thread 13, inside metallic thread 18 and power line 23.

Figure 4:
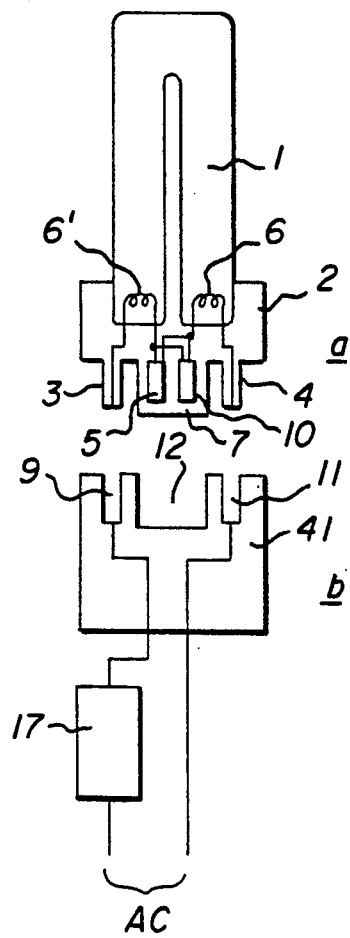
FIG. 4 is another example of the prior art.

In another version of the prior art no screw-in base is used but the compact light is inserted directly into a matching female receptacle, item b, in the light fixture as shown in FIG. 4, items a and b.

Since the arc discharge in the compact light 1 has a so-called negative resistance, the inductance of ballast 17 limits the current in compact light 1 to a safe value that does not exceed the allowable value for compact light 1. If, however, the ballast should become shorted in a shorted failure mode, for example as a result of insulation breakdown between some of its windings, the current in the compact light 1 will immediately begin to rise to a value that will destroy the compact light 1. If the ballast should suffer a break in its wire it will fail in an open failure mode, and the compact light 1 will remain dark. In case the compact light 1 has been destroyed, or fails due to extended life, no current will flow through it.

FIG. 2 shows the test device 24 which has an adapter 26 connected by a cord 27 to main part 28. The main part 28 has female terminals 29, 31 that mate with respective pins 3 and 4 when a compact light 1 is plugged into the main part 28. The adapter 26 has two pins 32, 33 that mate with respective female terminals 9, 11 in the adapter 8, when plugged into the adapter 8.

It should be noted that compact lights are provided with different types of bases which each require a matching receptacle in the light fixture.

When the test device is plugged into the circuit between a known good compact light 1, in the following used as a test light and called "test light" 1', and the adapter 8, a first conducting path is provided between pin 3 of the test light 1' and female terminal 9 of adapter 8 via female terminal 29 of main part 28, a current-limiting capacitor C which advantageously may be one of a group of capacitors Ca, Cb and Cc (FIG. 3) of which one can be selected by a slide switch 30 to accommodate the wattage of the test light 1' (FIG. 2). The momentary make switch S1, when it is operated by push button 34, closes a circuit through conductor 36 of cord 27 and pins 32 and 33 of adapter 26. A second conducting path is provided between pin 4 of test light 1', female terminal 31 of main part 28, momentary make switch S2 when it is operated by push button 37, conductor 38 of cord 27 and pins 33 and 32 of adapter 26.

It follows that the adapter 26 in FIG. 2 could advantageously be arranged with a screw thread 13 and have a built-in ballast 17 so that it could fit directly into a light fixture equipped with a socket matching the base 26 of the compact light.

A voltage indicator light I1 is connected between conductors 36, 38 of cord 27, and indicates immediately when switch S1 is operated whether ac-voltage is present from the adapter 8. In case no light is showing on voltage indicator light I1, and ac-power is known to be on at the light fixture, the indication is that the ballast 17 is failing in the open mode, which is a rarely occurring failure mode. The voltage indicator light I1 is advantageously a small neon light, e.g. of the type NE2 made by General Electric and others. The neon light I1 requires a series resistor R1 of approximately 15-50 k ohms to limit current flow through the neon light. The voltage indicator I1 may also be a voltmeter.

A current indicator in the form of a second light indicator I2, also advantageously a neon light, indicates simultaneously if the test light 1' is operative by drawing current from conductor 38 in cord 27 through the capacitor C, through the test light 1' and through current indicator light I2, and momentary switch S1, when it is operated, and back to conductor 36 of cord 27. If test light 1' is inoperative no current will flow through it and current indicator I2 will remain dark. Next, momentary switch S2 is closed simultaneously with switch S1, and the test light 1' will draw almost full current, but limited by the capacitor C. If ballast 17 is operative voltage indicator I1 will remain lighted and current continuity indicator light I2 will be shunted out and the test light 1' will light. In case, however, that ballast 17 is shorted in the shorted failure mode, voltage light indicator I1 will remain lighted, and current light indicator I2 will remain lit, but test light 1' will not light.

FIG. 3 is a circuit diagram of the invention showing light-emitting diodes (LED's) used for light indicators instead of neon lights, which has the advantage that more precise indications can be attained. I1 is composed of two anti-parallel LED's in series with a current-limiting resistor R1. Light indicator I2 is composed of two anti-parallel LED's in series with a current limiting resistor R2 which can be selected so as to prevent excessive current in the LED's. A fuse F provides short-circuit protection for the entire test device.

FIG. 4 is another version of the prior art showing the compact light 1 inserted directly with its base 2 in a matching socket 41 of the light fixture without an intervening threaded adapter 8 as shown in FIG. 1. In this case the ballast 17 is mounted externally to the socket 41.

Figure 5:
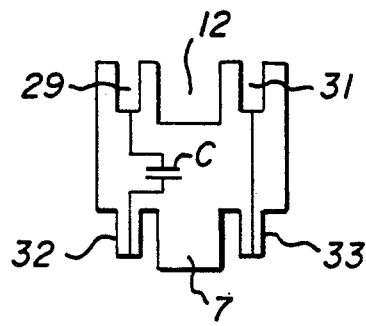
FIG. 5 is simplified version of the compact light tester.

FIG. 5 is a diagrammatic view of a simple tester which is suitable for home use. It is configured to be inserted between items a and b of FIG. 4, or items a and b of FIG. 1. It has a series capacitor C in series with the lamp circuit. In operation it is inserted with its bottom pins 32, 33 in the light fixture shown as item b in FIG. 4, and a known good test light with wattage fitting the capacitor is inserted in the top part. If the ballast 17 in FIG. 4 or FIG. 1 is failing in the open mode, the test light will show no light, and if the ballast 17 is failing in the shorted mode no light will be emitted from the known good test light. If the test light shows light emission, the ballast 17 is known to be good.

Figure 6:
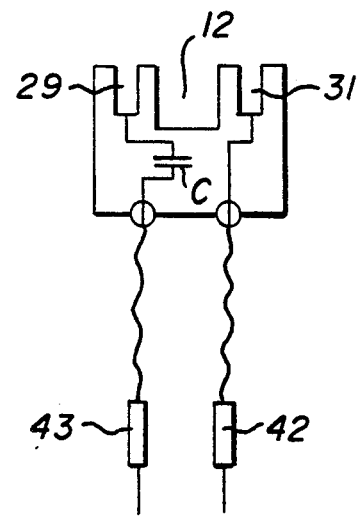
FIG. 6 is a simplified version of the tester having flexible probes.

FIG. 6 shows another version of the simple lamp tester, which instead of pins 32, 33 has two flexible wired probes 42, 43, which can be inserted into the female terminals 9, 11 or into any other form of receptacle as the case may be. Again, a capacitor C is provided to limit the current in case the ballast is shorted.

I claim:

1. A test device for testing a circuit for operating a compact fluorescent light, the device having first and second terminals for connecting the compact fluorescent light to an ac-power source including first and second ac-power lines, and a ballast in said ac-power source, comprising first and second conducting paths respectively connecting said first and second terminals with said first and second ac-power lines, a known good fluorescent test light connected between said first and second conducting paths at said first and second terminals, the test device having current indicating means in said second conducting path for testing presence of electric current in said second conducting path, and voltage indicating means for indicating presence of voltage between said first and second conducting path, a first make switch in said first conducting path operative for connecting said voltage indicating means with said second conducting path, a second make switch in said second conducting path operative for shorting said current indicating means, a current-limiting capacitor in said first conducting path disposed between said first make switch and said test light, detachable connecting means for detachably connecting said test device between said compact fluorescent test light and said ac-power source, a test device housing having receiving means for receiving said compact fluorescent test light, and releasable plug-in means for releasably plugging-in said test device into said ac-power source.

2. A test device according to claim 1 including a neon light in said current indicating means.

3. A test device according to claim 1 including at least one light-emitting diode in said current indicating means.

4. A test device according to claim 1, including a neon light in said voltage indicating means.

5. A test device according to claim 1, including at least one light-emitting diode in said voltage indicating means.

6. A test device according to claim 3, including at least one light emitting diode in said voltage indicating means.

7. A test device according to claim 1, wherein said first make switch is a momentary switch.

8. A test device according to claim 1, wherein said second make switch is a momentary switch.

9. A test device according to claim 1, including a fuse in series with said ac-power source for protecting said ac-power source.

10. A test device according to claim 1, wherein said current-limiting capacitor is divided into a plurality of different current-limiting capacitors, and including a selector switch for selectively selecting at least one of said plurality of current-limiting capacitors.

* * * * *